(12) United States Patent
Furutani (10) Patent No.: US 8,995,216 B2
(45) Date of Patent: Mar. 31, 2015

(54) SEMICONDUCTOR DEVICE WITH REFRESH CONTROL CIRCUIT

(75) Inventor: Kiyohiro Furutani, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 332 days.

(21) Appl. No.: 13/531,807

(22) Filed: Jun. 25, 2012

(65) Prior Publication Data

US 2012/0263004 A1  Oct. 18, 2012

(30) Foreign Application Priority Data

Dec. 18, 2008  (JP) ................................ 2008-321718

(51) Int. Cl.
| | | |
|---|---|---|
| *G11C 7/00* | (2006.01) | |
| *G11C 8/06* | (2006.01) | |
| *G11C 8/08* | (2006.01) | |
| *G11C 8/18* | (2006.01) | |
| *G11C 11/406* | (2006.01) | |

(52) U.S. Cl.
CPC .. *G11C 8/06* (2013.01); *G11C 8/08* (2013.01); *G11C 8/18* (2013.01); *G11C 11/406* (2013.01); *G11C 11/40615* (2013.01); *G11C 2211/4067* (2013.01)
USPC ........... 365/222; 365/226; 365/227; 365/228; 365/229; 365/233.15

(58) Field of Classification Search
CPC ................ G11C 5/144; G11C 11/406; G11C 11/40611; G11C 11/40615
USPC ............. 365/222, 226, 227, 228, 229, 233.15
See application file for complete search history.

(56) References Cited

U.S. PATENT DOCUMENTS

| | | | |
|---|---|---|---|
| 5,321,662 A | | 6/1994 | Ogawa |
| 6,055,206 A | * | 4/2000 | Tanizaki et al. .......... 365/230.06 |
| 6,137,743 A | * | 10/2000 | Kim .............................. 365/222 |
| 6,525,984 B2 | | 2/2003 | Yamagata et al. |
| 7,345,940 B2 | * | 3/2008 | Oh ................................ 365/222 |
| 7,492,658 B2 | | 2/2009 | Oh |

FOREIGN PATENT DOCUMENTS

| | | |
|---|---|---|
| JP | 5-210976 | 8/1993 |
| JP | 6-124587 | 5/1994 |
| JP | 9-7367 | 1/1997 |

* cited by examiner

*Primary Examiner* — Vanthu Nguyen
(74) *Attorney, Agent, or Firm* — McGinn IP Law Group, PLLC (57) ABSTRACT

In a semiconductor device including a row-based control circuit applied with a current reduction circuit having a standby state and an active state, a refresh control circuit generates a refresh request signal every predetermined time interval on a self-refresh mode and time-sequentially generates an internal active signal at N times in connection with the refresh request signal once. The row-based control circuit time-sequentially refreshes information of memory cells on the based of the internal active signal at the N times. The refresh control circuit inactivates the row-based control circuit by making the current reduction circuit the standby state.

18 Claims, 5 Drawing Sheets

SEMICONDUCTOR DEVICE WITH REFRESH CONTROL CIRCUIT

This application is a divisional application of U.S. patent application Ser. No. 12/654,109, filed on Dec. 10, 2009, now U.S. Patent No. 8,248,879.

This application is based upon and claims the benefit of priority from Japanese patent application No. 2008-321718, filed on Dec. 18, 2008, the disclosure of which is incorporated herein in its entirety by reference.

BACKGROUND OF THE INVENTION

1. Field of the Invention

This invention relates to a semiconductor device, and more particularly, to a dynamic semiconductor memory device comprising a self-refresh circuit and a refresh control method thereof.

2. Description of Related Art

In the manner which is well known in the art, a dynamic random access memory (which will later be also called "DRAM") is a dynamic semiconductor memory device comprising a plurality of memory cells each of which comprises a switching transistor and a data storing capacitor. Therefore, the DRAM becomes widespread as a semiconductor memory adequate for integration in a semiconductor substrate.

In the DRAM, inasmuch as a data signal is held by the capacitor, it is necessary for "refresh operation" so as to periodically amplify the data signal stored in the capacitor to rewrite it. In other words, electric charges charged in the capacitor gradually discharge by a leak current and eventually data disappears. Therefore, it is necessary to carry out rewrite (refresh) for a memory cell each a constant time interval. The constant time interval is called "a refresh interval".

In the DRAM, an address of the memory cell is indicated by (row×column) and on specifying an address through an address bus, the address signal is delivered by dividing it into a row address and a column address without delivering at a time. In this event, a control signal for passing bits of the row address to the DRAM through the address bus is called a row address strobe signal /RAS while a control signal for passing bits of the column address to the DRAM is called a column address strobe signal /CAS. In addition, normally, in a state where the row address strobe signal /RAS is produced for outputs of the row address, the column address strobe signal /CAS is produced for outputs of the column address.

In the refresh operation, for example, by producing the row address strobe signal /RAS with the column address strobe signal /CAS is produced for the DRAM, all of the memory cells on a row (a word line) selected (designated) by the row address are simultaneously refreshed. Whenever the column address strobe signal /CAS and the row address strobe signal /RAS are inputted at the above-mentioned timing, the row is successively shifted to refresh the memory cells in turn.

Normally, the refresh operation for one cycle is carried out for a duration until the leading edge of the row address strobe signal /RAS from the falling edge thereof after a refresh address is obtained from a refresh address counter. This duration is called a "refresh duration". Normally, a normal operation duration follows after the refresh duration. A duration obtained by adding the refresh duration with the normal operation duration is the above-mentioned "refresh interval".

In recent years, most of the DRAMs have a function which can carry out the refresh operation without requiring a refresh control from an outside. This function is generally called a "self-refresh function". That is, the self-refresh function adopts a method of generating, inside of a chip, not only the refresh address but also the row address strobe signal /RAS. This method is called a "self-refresh method". In the self-refresh method, refresh of a memory cell array is carried out by automatically generating a refresh request signal by an internal refresh timer and by automatically generating a RAS-based signal inside the chip.

In addition, a refresh period corresponds to a time length until one row in the memory cell array is next refreshed from being refreshed once.

Various dynamic semiconductor memory devices comprising such a refresh function are already proposed.

By way of illustration, Japanese Unexamined Patent Application Publication of Tokkai No. Hei 6-124587 or JP-A 6-124587 (which will be also called Patent Document 1), which corresponds to U.S. Pat. No. 5,321,662, discloses an improved dynamic random access memory (DRAM) having self refresh mode. In the DRAM disclosed in Patent Document 1, at an initial duration and/or a final duration of a self-refresh duration, a concentrated refresh using a refresh clock signal having a short period is carried out for all rows in a memory cell array.

In addition, Japanese Unexamined Patent Application Publication of Tokkai No. Hei 9-7367 or JP-A 9-7367 (which will be also called Patent Document 2) discloses a refresh apparatus for DRAM which is capable of decreasing power consumption and of shorting the time required for mode transition from an auto-refresh mode to a self-refresh mode in the DRAM.

On the other hand, in order to make a semiconductor integrated circuit operate at a low voltage, a technique for reducing the increase of a standby current which occurs in a case of lowering a threshold value of a transistor is known. Such a technique is called a sub threshold current reduction circuit (SCRC) in this field. Such a SCRC is, for example, disclosed in Japanese Unexamined Patent Application Publication of Tokkai No. Hei 5-210976 or JP-A 5-210976 (which will be also called Patent Document 3).

Conventionally, in the DRAM used in a portable equipment in a cellular phone or the like, a power supply circuit operable at a low voltage and a low power consumption are required. Under a such request, in order to reduce a current on standby, the sub threshold current reduction circuit (SCRC) is applied to a command decoder, a row-based control circuit, a column-based control circuit, and so on. However, among these circuits, the row-based control circuit carries out operation on the self-refresh operation also. The row-based control circuit activates a word line row by row in turn to refresh memory cells connected to the word line. In this event, in a conventional DRAM, the row-based control circuit is activated from a standby state and refreshes the memory cells by activating the word line only one row, and the row-based control circuit is tuned back to the standby state after each refresh completes. Accordingly, the DRAM periodically switches a standby state and an active state every when the word line is refreshed row by row. As a result, the conventional DRAM is disadvantageous in that it is impossible to contrarily reduce a self-refresh current due to charge and discharge of the sub threshold current reduction circuit (SCRC) by switching of activation (active state)/inactivation (standby state) of the row-based control circuit.

SUMMARY

The present invention seeks to solve one or more of the above problems, or to improve upon those problems at least in part.

In one embodiment, there is provided a semiconductor device that includes a plurality of memory cells each of which is required with refresh of information every predetermined time interval, a first power supply line, a second power supply line having a potential lower than that of the first power supply line, and a first circuit connected between the first and second power supply lines. The first circuit is operable at potentials of the first and the second supply lines and accesses the plurality of memory cells. Third and fourth power supply lines supply the first and the second power supply lines with potentials, respectively, which are necessary for the first circuit to operate in an active. A first switch is connected between the first and the third power supply lines. The first switch electrically controls a potential required to operate the first circuit in the active by a first control signal. A second switch is connected between the second and the fourth power supply lines. The second switch electrically controls a potential required to operate the first circuit in the active by the first control signal. A refresh control circuit generates a refresh request signal every the predetermined time interval to refresh information of the memory cells through the first circuit. The refresh control circuit time-sequentially generates an internal active signal at N times in connection with the refresh request signal once and maintains activation of the first control signal during a first time interval which is a duration in connection with the internal active signals at the N times without making a change to a logic value of the first control signal, where N represents a first integer which is not less than two. The first circuit is put into a state to enable to operate in the active by the potentials supplied from the third and the fourth power supply lines in response to the first control signal which is activated for the first time interval. The first circuit time-sequentially refreshes information in the plurality of memory cells in response to the internal active signals at the N times. The first and the second switches stop supply of potentials required to operate the first circuit in the active during a duration other than the first time interval.

In another embodiment, there is provided a semiconductor device that includes a row-based control circuit applied with a current reduction circuit which has a standby state and an active state and which reduces a sub-threshold current in the current reduction circuit by controlling a potential of a power supply in the current reduction circuit at the standby state. The semiconductor device comprises a refresh control circuit making the row-based control circuit the active state by releasing the standby state at a self-refresh mode which independently refreshes information in a plurality of memory cells at plural times asynchronous to an outside. The refresh control circuit time-sequentially generates an internal active signal at N times in connection with a refresh request signal once, time-sequentially activates N word lines in response to the internal active signal at the N times to refresh information in the memory cells connected to the respective word lines, and inactivates the row-based control circuit by making the current reduction circuit the standby state, where N represents an integer which is not less than two.

In still another embodiment, there is provided a refresh control method that is of controlling a self-refresh operation of a semiconductor device comprising a row-based control circuit and a refresh control circuit. The row-based control circuit is applied with a current reduction circuit which has a standby state and an active state and which reduces a sub-threshold current in the current reduction circuit by controlling a potential of a power supply in the current reduction circuit at the standby state. The method includes generating, in the refresh control circuit, a refresh request signal every predetermined time interval on a self-refresh mode which independently refreshes information of a plurality of memory cells at plural times asynchronous to an outside, time-sequentially generating, in the refresh control circuit, an internal active signal at N times in connection with the refresh request signal once, where N represents a first integer which is not less than two, maintaining the active state of the current reduction circuit during a first time interval which is a duration in connection with the internal active signals at the N times to make the row-based control circuit the active state, time-sequentially refreshing, in the row-based control circuit, information of the plurality of memory cells based on the internal active signal at the N times, respectively, and inactivating, in the refresh control circuit, the current reduction circuit during a duration other than the first time interval to control the row-based control circuit to the standby state.

BRIEF DESCRIPTION OF THE DRAWINGS

The above feature and advantages of the present invention will be more apparent from the following description of certain preferred embodiments taken in conjunction with the accompanying drawing, in which.

DETAILED DESCRIPTION OF PREFERRED EMBODIMENTS

The invention will now described herein with reference to illustrative embodiments. Those skilled in the art will recognize that many alternative embodiments can be accomplished using the teachings of the present invention and that the invention is not limited to the embodiments illustrated for explanatory purpose.

Figure 1:
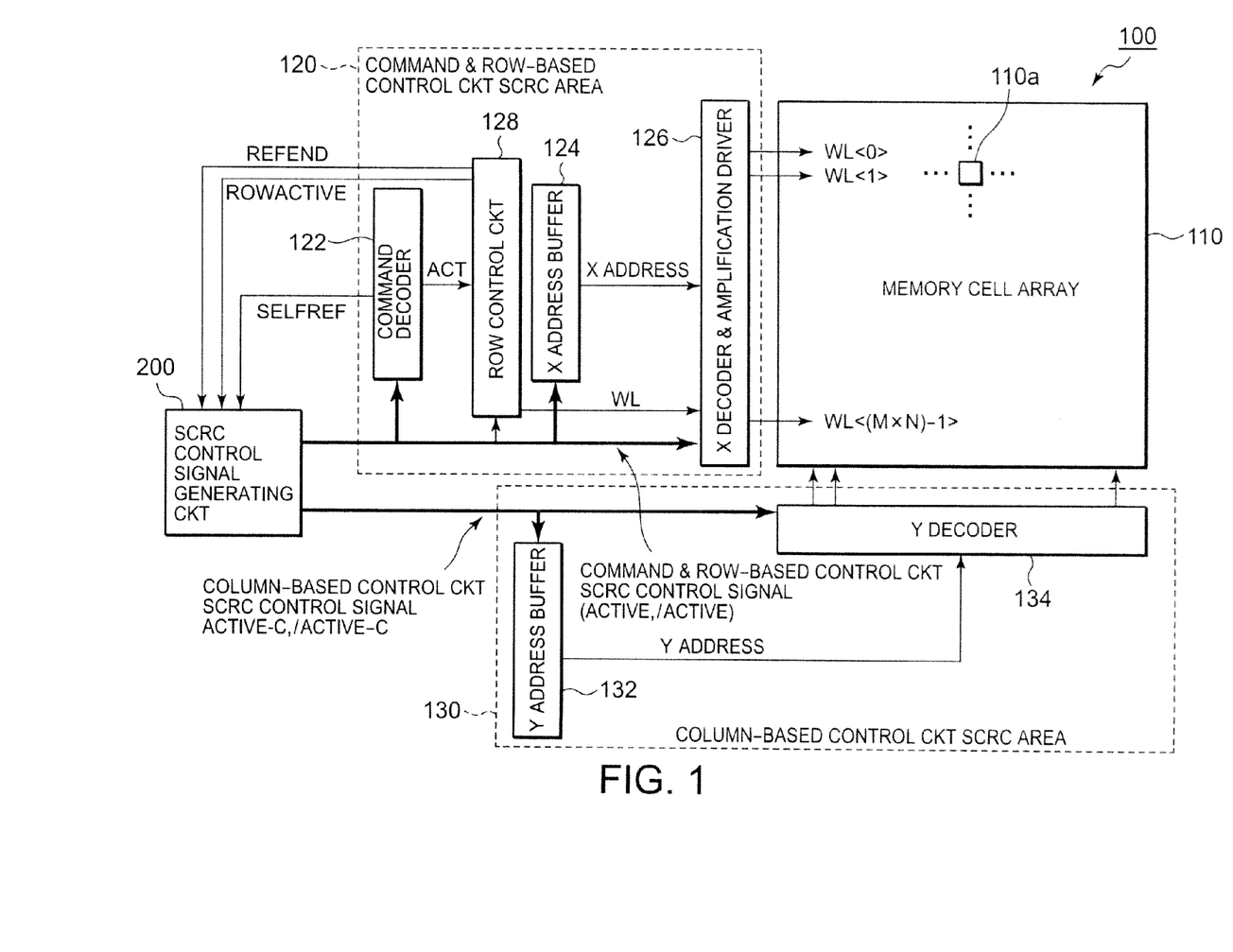
FIG. 1 is a block diagram showing structure of a dynamic semiconductor memory device to which a refresh control method according to this invention is applicable.

Referring to FIG. 1, the description will proceed to a dynamic semiconductor memory device to which a refresh control method according to this invention is applicable. The dynamic semiconductor memory device comprises a DRAM circuit 100 and a SCRC control signal generating circuit 200.

The DRAM circuit 100 comprises a memory cell array 110, a command and row-based control circuit SCRC area 120, and a column-based control circuit SCRC area 130.

SCRC drivers of the command and row-based control circuit SCRC area 120 and the column-based control circuit SCRC area 130 are controlled by the SCRC control signal generating circuit 200. Details on a self-refresh control circuit 201 included in the SCRC control signal generating circuit 200 will later be described with reference to FIG. 4.

A sub threshold current reduction circuit (SCRC) is used in the command and row-based control circuit SCRC area 120 and the column-based control circuit SCRC area 130 other than the SCRC control signal generating circuit 200. Details on the sub threshold current reduction circuit (SCRC) will later be described with reference to FIG. 2.

The SCRC control signal generating circuit 200 receives, from the command and row-based control circuit SCRC area 120, a row active signal ROWACTIVE and a self-refresh duration signal SELFREF which will later be described. Responsive to the row active signal ROWACTIVE and the self-refresh duration signal SELFREF, the SCRC control signal generating circuit 200 sends a command and row-based control circuit SCRC control signal and a column-based control circuit SCRC control signal to the command and row-based control circuit SCRC area 120 and the column-based control circuit SCRC area 130, respectively.

The SCRC control signal generating circuit 200 comprises the self-refresh control circuit (symbol 201 in FIG. 4) for the DRAM circuit 100 which will later be described.

Inasmuch as the column-based control circuit SCRC area 130 does not operate on a self-refresh, the column-based control circuit SCRC area 130 is put into a standby state by the column-based control circuit SCRC control signal (ACTIVE-C and an inverted signal /ACTIVE-C thereof). On the other hand, inasmuch as the command and row-based control circuit SCRC area 120 operates on the self-refresh, the command and row-based control circuit SCRC area 120 is turned on/off by the command and row-based control circuit SCRC control signal in the manner which will later be described.

The memory cell array 100 comprises a lot of memory cells 110a each storing one bit which are arranged in a matrix fashion in a row direction and a column direction. By an address signal supplied from the outside, a row address (an X address) and a column address (a Y address) which are an access object of the memory cell array 100 are designated.

The command and row-based control circuit SCRC area 120 comprises a command decoder 122, an X address buffer (a row address buffer) 124, an X decoder and sense amplification driver (a row decoder and sense amplification driver) 126, and a row control circuit 128. Among the command and row-based control circuit SCRC area 120, the above-mentioned portions except for the command decoder 122 are called a row-based control circuit.

The command decoder 122 discriminates a control command defined on the bases of a combination pattern of the command and row-based control circuit SCRC control signal and sends, to each portion, control signals corresponding to operation contents. In addition, the command and row-based control circuit SCRC control signal will later be described with reference to FIG. 4.

The X address buffer (the row address buffer) 124 holds an X address (a row address) designated by the address signal. The X address and sense amplification driver (the row address and sense amplification driver) 126 is controlled by the row control circuit 128 which receives from the command decoder 122 an output control signal and so on. The X address and sense amplification driver (the row address and sense amplification driver) 126 selects a word line WL corresponding to the X address (the row address) designated and activates a sense amplifier arranged in a column side.

The column-based control circuit SCRC area 130 comprises a Y address buffer (a column address buffer) 132 and a Y decoder (a column decoder) 134.

The Y address buffer (the column address buffer) 132 holds a Y address (a column address) designated by the address signal. The Y decoder (the column decoder) 134 selects a bit line corresponding to the Y address (the column address) designated.

Figure 2:
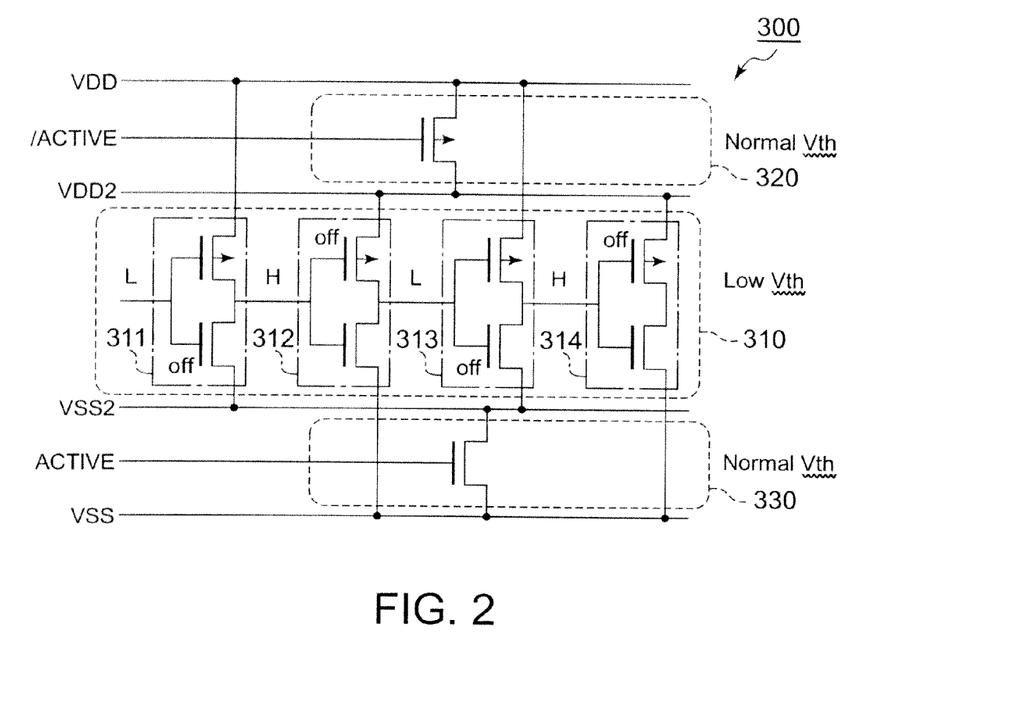
FIG. 2 is a circuit diagram showing an example of a sub threshold current reduction circuit (SCRC) for use in a peripheral circuit of a DRAM illustrated in FIG. 1.

FIG. 2 is a circuit diagram showing an example of the sub threshold current reduction circuit (SCRC) depicted at 300 used in a peripheral circuit of the DRAM circuit 100 illustrated in FIG. 1.

Although the sub threshold current reduction circuit (SCRC) 300 illustrated in FIG. 2 is for describing a basic structure and operation thereof, structure of the above-mentioned command and row-based control circuit SCRC area 120 and the above-mentioned column-based control circuit SCRC area 130 are not always restricted to that illustrated in FIG. 2.

The illustrated sub threshold current reduction circuit (SCRC) 300 comprises a logic portion 310, a first switch circuit 320, and a second switch circuit 330.

In addition, the first switch circuit 320 and the second switch circuit 330 are collectively called a SCRC driver.

The sub threshold current reduction circuit (SCRC) 300 are connected to first and second power supply lines VDD (a third power supply line) and VSS (a fourth power supply line) and first and second different power supply lines VDD2 (a first power supply line) and VSS2 (a second power supply line). Supplied to the first power supply line VDD, a first power supply voltage VDD is higher than a second power supply voltage VSS supplied to the second power supply line VSS. Namely,

VDD>VSS.

In addition, the first different power supply line VDD2 is supplied with the first power supply voltage VDD through the first switch circuit 320 while the second different power supply line VSS2 is supplied with the second power supply voltage VSS through the second switch circuit 330. On standby, the first switch circuit 320 and the second switch circuit 330 (the SCRC driver) are turned off and supply of the first power supply voltage VDD to the first different power supply line VDD2 and supply of the second power supply voltage VSS to the second different power supply line VSS2 are interrupted.

In addition, the first different power supply line VDD2 corresponds to the first power supply line described in claim, the second different power supply line VSS2 corresponds to the second power supply line described in claim, the first power supply line VDD corresponds to the third power supply line described in claim, and the second power supply line VDD corresponds to the fourth power supply line described in claim.

The second power supply line VSS2 has a potential lower than that of the first power supply line VDD2.

The illustrated logic portion 310 is a circuit where first through fourth CMOS inverter circuits 311, 312, 313, and 314 are cascade connected. Each of the first through the fourth CMOS inverter circuits 311 to 314 comprises a p-channel MOS transistor and an n-channel MOS transistor. A low Vth transistor (a low threshold transistor) is used as each of the transistors constructing the logic portion 310. The logic portion 310 serves as a first circuit which is operable at potentials of the first and the second supply lines VSS2 and VDD2 and accesses a plurality of memory cells 110a (FIG. 1). The first circuit 310 is a circuit in relation to the word lines WL connected to the memory cells 110a.

The first switch circuit 320 is connected between the first power supply line VDD and the first different power supply line VDD2. The illustrated first switch circuit 320 comprises a p-channel MOS transistor. The p-channel MOS transistor has a gate which is supplied with an inverted active signal /ACTIVE. In addition, a symbol /represents an inverted signal and /ACTIVE means an inverted signal of ACTIVE. The p-channel MOS transistor has a source connected to the first power supply line VDD and a drain connected to the first different power supply line VDD2. The first switch circuit 320 serves as a first switch which electrically controls a potential required to operate the first circuit 310 in the active by a first control signal /ACTIVE.

The second switch circuit 330 is connected between the second power supply line VSS and the second different power supply line VSS2. The illustrated second switch circuit 330 comprises an n-channel MOS transistor. The n-channel MOS transistor has a gate which is supplied with an active signal ACTIVE. The n-channel MOS transistor has a source connected to the second power supply line VSS and a drain connected to the second different power supply line VSS2. The second switch circuit 330 serves as a second switch which electrically controls a potential required to operate the first circuit 310 in the active by a first control signal ACTIVE.

Although in the sub threshold current reduction circuit (SCRC) 300 illustrated in FIG. 2, the first switch circuit 320 comprises the p-channel MOS transistor while the second switch circuit 330 comprises the n-channel MOS transistor, the first switch circuit 320 may comprise an n-channel MOS transistor while the second switch circuit 330 may comprise a p-channel MOS transistor. In this event, the first switch circuit 320 is supplied with the active signal ACTIVE while the second switch circuit 330 is supplied with the inverted active signal /ACTIVE.

A normal Vth transistor (a normal threshold transistor) is used as each of the transistors constructing the first and the second switch circuits 320 and 330 (the SCRC driver).

As shown in FIG. 2, sources of the p-channel MOS transistors in the first and the third CMOS inverter circuits 311 and 313 are connected to the first power supply line VDD while sources of the p-channel MOS transistors in the second and the fourth CMOS inverter circuits 312 and 314 are connected to the first different power supply line VDD2. In addition, sources of the n-channel MOS transistors in the second and the fourth CMOS inverter circuits 312 and 314 are connected to the second power supply line VSS while sources of the n-channel MOS transistors in the first and the third CMOS inverter circuits 311 and 313 are connected to the second different power supply line VSS2.

On standby, it is assumed that each node of the logic portion 310 is put into that illustrated in FIG. 2. Specifically, an input of the first CMOS inverter circuit 311 takes a logic "L" level, an output of the first CMOS inverter circuit 311 (an input of the second CMOS inverter circuit 312) takes a logic "H" level, an output of the second CMOS inverter circuit 312 (an input of the third CMOS inverter circuit 313) takes a logic "L" level, and an output of the third CMOS inverter circuit 313 (an input of the fourth CMOS inverter circuit 314) takes a logic "H" level.

In this event, the transistors to be turned off alternately occur as shown in FIG. 2. In the low Vth transistor, a leak current flows although Vgs=0 volts. As a result, the transistors to be turned off do not turn perfectly and a current on standby flows.

Therefore, in the sub threshold current reduction circuit (SCRC) 300, the sources of the transistors to be turned off are connected to the different power supply lines (VDD2, VSS2) and are interrupted by the normal Vth transistors on standby, and it results in reducing the current on standby.

Incidentally, on active, it is necessary to connect the first different power supply line VDD2 with the first power supply line VDD and to connect the second different power supply line VSS2 with the second power supply line VSS. As a consequence, the inverted active signal /ACTIVE is changed to the logic "L" level to turn the first switch circuit 320, which connects the first power supply line VDD with the first different power supply line VDD2, on and the active signal ACTIVE is changed to the logic "H" level to turn the second switch, which connects the second power supply line VSS with the second different power supply line VSS2, on.

If a size of the transistor in the first and the second switch circuits 320 and 330 (the SCRC driver) is not about one-thirds of total of sizes of the transistors of the low Vth logic portion 310, operation of the logic portion 310 become slow due to a drop of voltage in the transistor portion. Accordingly, when switching of standby and active frequently occurs, charge and discharge currents in the gate of the transistors become large. It results in causing problem so that a consumed current increases contrarily by applying the sub threshold current reduction circuit (SCRC) 300.

Specifically, with lowering of the first power supply voltage VDD supplied to the first power supply line VDD, generation using a pump is carried out so as to step a level of the active signal ACTIVE on active up to the first power supply voltage VDD or more by the pump and so as to make a level of the inverted active signal /ACTIVE on active become a negative voltage less than the second power supply voltage VSS supplied to the second power supply line VSS. In this event, this problem further becomes remarkable because excess power is required in order to generate the high voltage or the negative voltage.

Attention will be directed to a case of applying the sub threshold current reduction circuit (SCRC) 300 illustrated in FIG. 2 to the DRAM circuit 100 in order to reduce the self-refresh current in the DRAM circuit 100.

Figure 3:
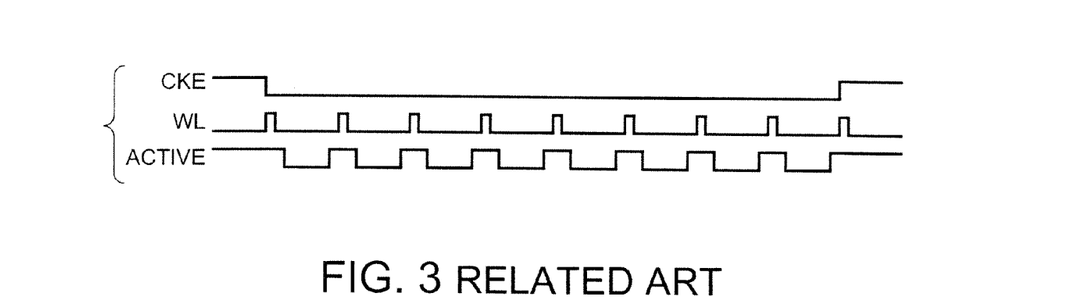
FIG. 3 is a time chart for use in describing operation of a conventional DRAM circuit.

Referring now to FIG. 3, operation of a related DRAM circuit will be described in order to facilitate an understanding of the present invention. In FIG. 3, CKE represents a clock enable signal supplied from an outside, WL represents a timing signal produced by the row control circuit in order to select the word line of the memory cell array 110 in accordance with the row address, and ACTIVE represents an active signal for activating the sub threshold current reduction circuit (SCRC) 300.

In the manner which is described above, the related DRAM circuit in which a low power consumption is required periodically carries out the self-refresh operation on the word line row by row as shown in FIG. 3. Therefore, the sub threshold current reduction circuit (SCRC) 300 also periodically switches on standby and on active by the active signal ACTIVE which changes row by row for the word line. As a result, the related DRAM circuit is disadvantageous in that it is impossible to reduce the self-refresh current due to the charge and discharge current on switching in the row-based control circuit to which the sub threshold current reduction circuit (SCRC) 300 is applied.

Figure 4:
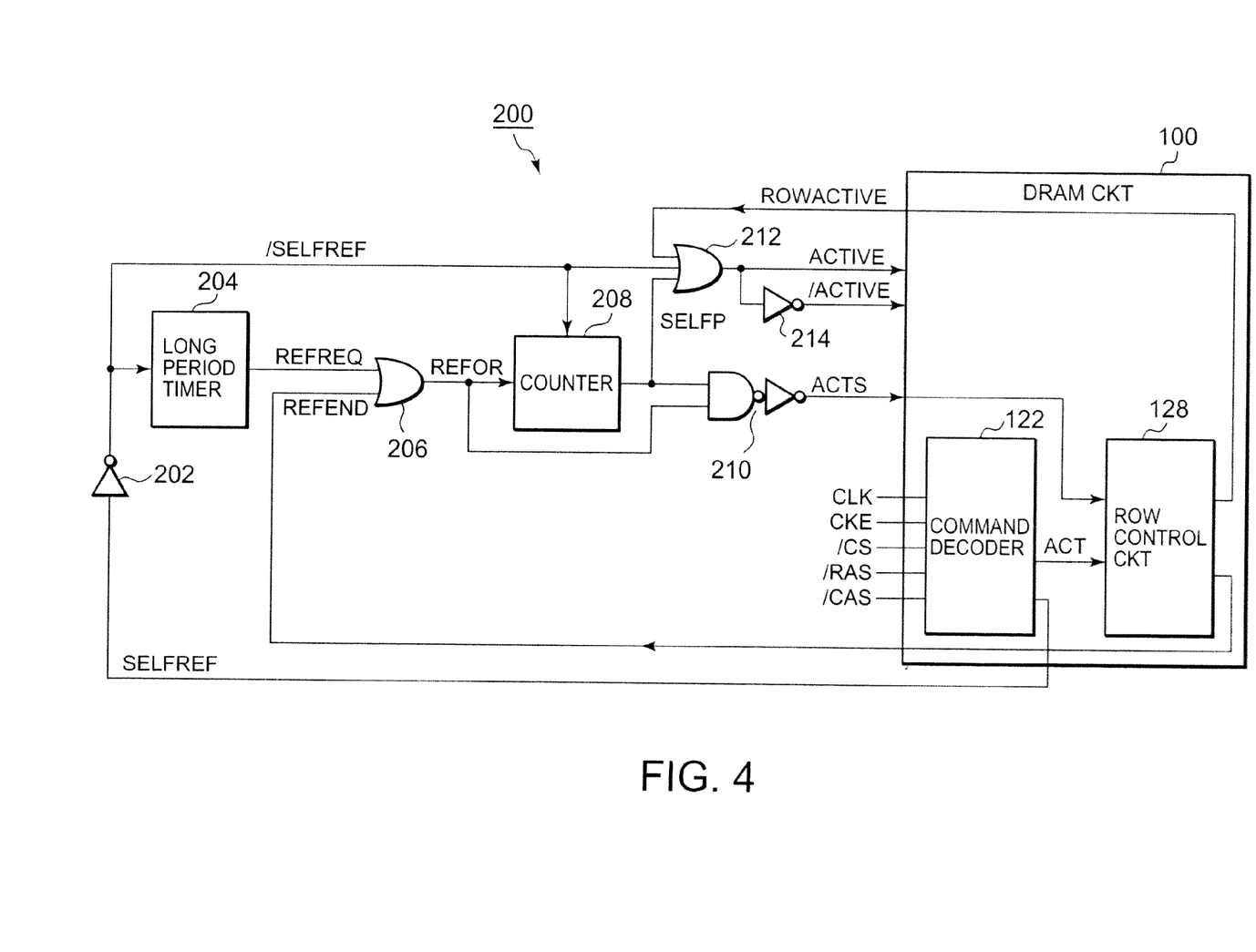
FIG. 4 is a circuit diagram showing a configuration example of a self-refresh control circuit included in a SCRC control signal generating circuit illustrated in FIG. 1.

Referring now to FIG. 4, the description will proceed to the self-refresh control circuit 201 which comprises a part of the SCRC control signal generating circuit 200 illustrated in FIG. 1. FIG. 4 is a circuit diagram showing a configuration example of the self-refresh control circuit 201 and comprises a distinctive structure of this invention. The self-refresh control circuit 201 acts as a refresh control circuit which generates a refresh request signal REFREQ every predetermined time interval Tp (FIG. 5) to refresh information of the memory cells 110a through the first circuit 310 (FIG. 2) in the manner which will be described as the description proceeds. The refresh is a self-refresh where the refresh control circuit 201 independently carries out the refresh at plural times asynchronous to an outside in response to a commence once from the outside.

In the manner which is described above, the command decoder 122 of the DRAM circuit 100 is supplied with the command and row-based control circuit SCRC control signal. Specifically, the command and row-based control circuit SCRC control signal comprises an active signal ACTIVE and an inverted active signal /ACTIVE in FIG. 4 which will later be described. The active signal ACTIVE and the inverted active signal /ACTIVE are collectively called the above-mentioned first control signal. In addition, the command decoder 122 is supplied from the outside with a clock signal CLK, a clock enable signal CKE, a chip select signal /CS, a row address strobe signal /RAS, and a column address strobe signal /CAS, which will be collectively called a command signal. The command decoder 122 decides a command based on a current state (mode) of the dynamic semiconductor memory device and the command signal supplied from the outside to send corresponding control signals to respective portions. It will be assumed that the current state (mode) of the dynamic semiconductor memory device is put into a standby state. When the command decoder 122 decides that the above-mentioned command signal indicates a self-refresh commend, the command decoder 122 produces a command result signal ACT and a self-refresh duration signal SELFREF. The self-refresh duration signal SELFREF is a signal indicative of a self-refresh duration.

In FIG. 4, the command decoder 122 and the row control circuit 128 comprises a part of the command and row-based control circuit SCRC area 120 illustrated in FIG. 1. Responsive to the decode result signal ACT sent from the command decoder 122 receiving an external signal or an internal active signal ACTS generated by the self-refresh control circuit 201, the row control circuit 128 produces a row active signal ROWACTIVE and a refresh end signal REFEND which will later be described. The row active signal ROWACTIVE is a signal having a logic "H" level for the duration of the refresh operation. The refresh end signal REFEND is a signal produced on receivable a next refresh command after the DRAM circuit 100 in question finishes the refresh by one row.

In the manner which will later be described, the self-refresh control circuit 201 comprises a refresh control arrangement which successively activates, on the self-refresh mode, N word lines by activating the command and row-based control circuit SCRC area 120 configured by applying the sub threshold current reduction circuit (SCRC) 300 (FIG. 2) to refresh memory cells 110a and thereafter inactivates the command and row-based control circuit SCRC area 120 to which the sub threshold current reduction circuit (SCRC) 300 is applied, where N represents a first integer which is not less than two. In the example being illustrated, the first integer N is equal to four.

More specifically, the self-refresh control circuit 201 comprises a first inverter circuit 202, a long period timer 204, a first OR circuit 206, a counter 208, an AND circuit 210, a second OR circuit 212, and a second inverter circuit 214.

It will be assume that the current state (mode) of the dynamic semiconductor memory device is put into the standby state. Supplied with the self-refresh command, the command decoder 122 produces the self-refresh duration signal SELFREF having the logic "H" level. That is, for the duration of the self-refresh mode, the self-refresh duration signal SELFREF takes the logic "H" level. In addition, the first inverter 202 inverts the self-refresh duration signal SELFREF to produce an inverted self-refresh duration signal /SELFREF.

Responsive to the inverted self-refresh duration signal /SELFREF, the long period timer 204 generates the refresh request signal REFREQ at a constant period Tp (FIG. 5) after entry of the self-refresh mode. That is, the long period timer 204 serves as a timer for determining a period of the active signal ACTIVE and the inverted active signal /ACTIVE on the self-refresh mode.

The first OR circuit 206 ORs the refresh request signal REFREQ and the above-mentioned refresh end signal REFEND to produce, as a first OR result signal, a refresh OR signal REFOR.

The counter 208 is a circuit which is activated by the inverted self-refresh duration signal /SELFREF and which produces a selection signal SELFP having a logic "H" level for a duration from a time instant when the refresh request signal REFREQ becomes the logic "H" level until the refresh end signal REFEND is supplied at three times or (N−1) times. In other words, while the self-refresh duration signal SELFREF indicates the self-refresh duration, the counter 208 counts up the refresh OR signal REFOR to produce the selection signal SELFP having the logic "H" level until a counted value thereof becomes the first integer N.

That is, a combination of the first OR circuit 206 and the counter 208 serves as a selection signal producing circuit that counts the refresh request signal REFREQ and the refresh end signal REFEND for the duration of the self-refresh duration signal SELFEF indicative of the self-refresh duration and that produces the selection signal SELFP until the counted value becomes the first integer N.

The AND circuit 210 ANDs the selection signal SELFP and the refresh OR signal REFOR to produce, as an AND result signal, the above-mentioned internal active signal ACTS. That is, for the duration of the selection signal SELFP indicative of the logic "H" level, the AND circuit 210 produces the internal active signal ACTS based on the refresh request signal REFREQ or the refresh end signal REFEND. By controlling the row control circuit 128 based on the internal active signal ACTS, the DRAM circuit 100 carries out the refresh at N times (four times) which correspond to four rows.

That is, for the duration of production of the selection signal SELFP, the AND circuit 210 serves as an internal activating circuit that generates, based on the refresh request signal REFREQ and the refresh end signal REFEND, the internal active signal ACTS for making the memory cells 110a refresh by successively activating N word lines.

The second OR circuit 212 ORs the row active signal ROWACTIVE, the inverted self-refresh duration signal /SELFREF and the selection signal SELFP to produce, as a second OR result signal, the active signal ACTIVE. Accordingly, while the inverted self-refresh duration signal /SELFREF or the selection signal SELFP or the row active signal ROWACTIVE takes the logic "H" level, the active signal ACTIVE becomes a logic "H" level. The active signal ACTIVE is one of switching signals for switching standby and active by turning the SCRC driver of the sub threshold current reduction circuit (SCRC) 200 (FIG. 2) in the DRAM circuit 100 on/off. In other words, the active signal ACTIVE becomes the switching signal for switching a standby state and an active state of the command and row-based control circuit SCRC area 120 illustrated in FIG. 1.

The second inverter circuit 214 inverts the active signal ACTIVE to produce the inverted active signal /ACTIVE as a complementary signal of the above-mentioned switching signal.

Accordingly, a combination of the first inverter circuit 202, the second OR circuit 212, and the second inverter circuit 214 serves as a standby/active switching circuit that generates, in response to the self-refresh duration signal SELFREF, the row active signal ROWACTIVE, and the selection signal SELFP, the switching signal for switching the standby and the active of the command and row-based control circuit SCRC area 120 to which the sub threshold current reduction circuit (SCRC) 300 (FIG. 2) is applied.

In the manner which is described above, a combination of the first inverter circuit 202, the first OR circuit 206, the counter 208, the AND circuit 210, the second OR circuit 212, and the second inverter circuit 214 acts as the refresh control arrangement that successively activates, on the self-refresh mode, the N word lines by activating the command and row-based control circuit SCRC area 120 to which the sub threshold current reduction circuit (SCRC) 300 (FIG. 2) is applied to refresh the memory cells 110*a* and thereafter inactivates the command and row-based control circuit SCRC area 120 to which the sub threshold current reduction circuit (SCRC) 300 (FIG. 2) is applied. The refresh control arrangement inactivates the command and row-based control circuit SCRC area 120 to which the sub threshold current reduction circuit (SCRC) 300 (FIG. 2) is applied in synchronism with selection end of the successively selected N word lines.

Although the number N of the successively selected word lines is equal to four in the example being illustrated, the number N may be easily changed to an arbitrary value by changing structure (the counted number) in the counter 208.

Figure 5:
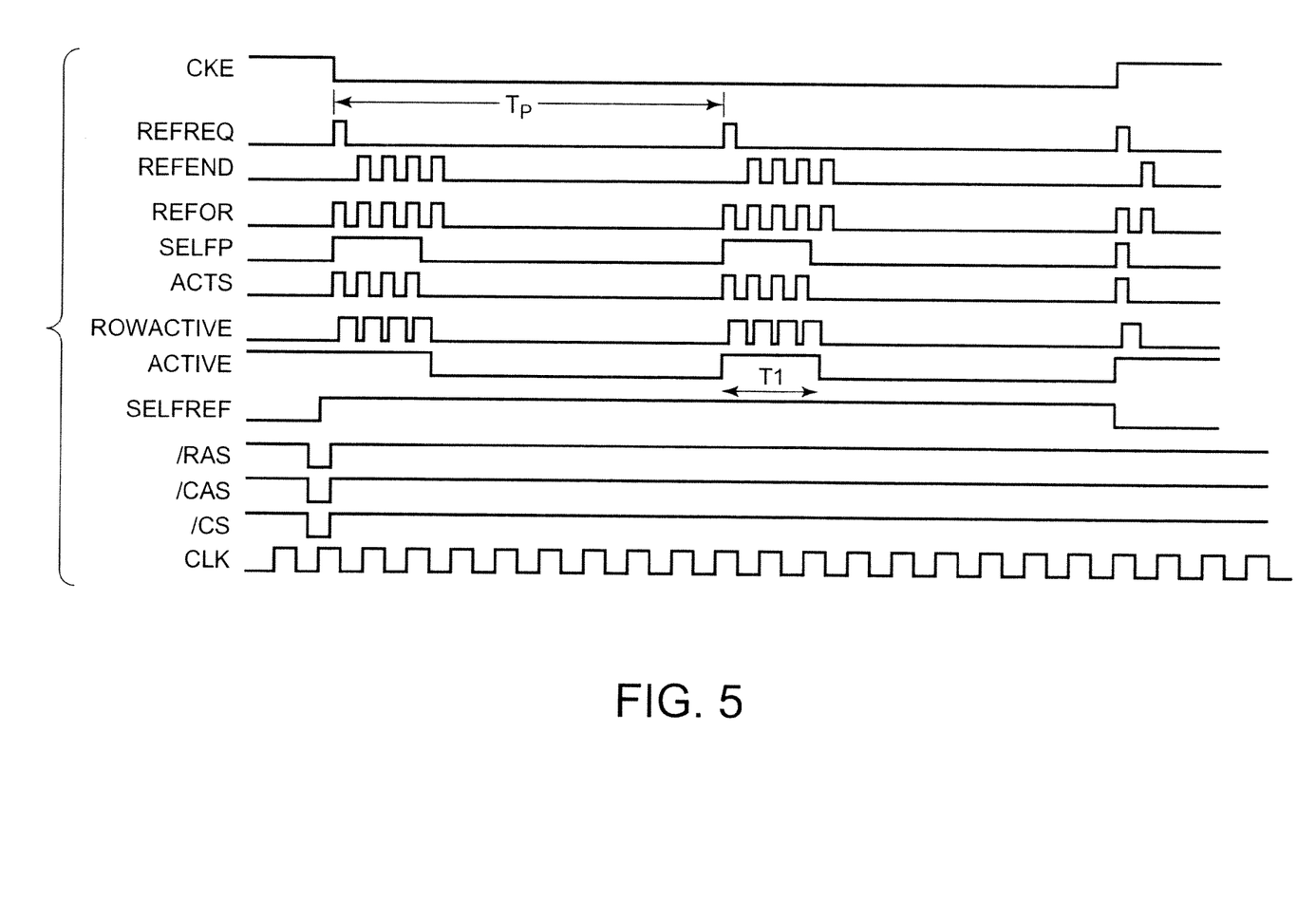
FIG. 5 is a time chart showing an example of operation of the self-refresh control circuit included in a SCRC control signal generating circuit illustrated in FIG. 1.

FIG. 5 is a time chart showing an example of operation of the self-refresh control circuit 201 illustrated in FIG. 4. It is understood that four pulses of the internal active signal ACTS are produced for the duration (a first time interval T1) of the active signal ACTIVE indicative of the logic "H" level. That is, refreshes of four rows are carried out for active once.

Specifically, the refresh control circuit 201 time-sequentially generates the internal active signal ACTS at N times in connection with the refresh request signal REFREQ once and maintains activation of the first control signal (ACTIVE and /ACTIVE) during the first time interval T1 which is the duration in connection with the internal active signal ACTS at the N times without making a change to a logic value of the first control signal (ACTIVE and /ACTIVE). The first time interval T1 is not more than a half of a period Tp of the refresh request signal REFREQ. The first time interval T1 relates to a time interval required to time-sequentially generate the internal active signal ACTS at the N times related to the refresh request signal REFREQ once, where N represents the first integer between four and eight, both inclusive.

The first circuit 310 (FIG. 2) is put into a state to enable to operate in the active by the potentials supplied from the third and the fourth power supply lines VDD and VSS in response to the first control signal (ACTIVE and /ACTIVE) which is activated for the first time interval T1. The first circuit 310 time-sequentially refreshes information in the plurality of memory cells 110*a* in response to the internal active signals ACTS at the N times.

The first and the second switches 320 and 330 stop supply of potentials required to operate the first circuit 310 in the active during a duration other than the first time interval T1.

All of the plurality of memory cells 110*a* are refreshed by the internal active signal ACTS at (M×N) times which are equal in number to a total count obtained by multiplying the refresh request signal REFREQ at M times by the internal active signal ACTS at the N times, where M represents a second integer which is not less than two.

Figure 6:
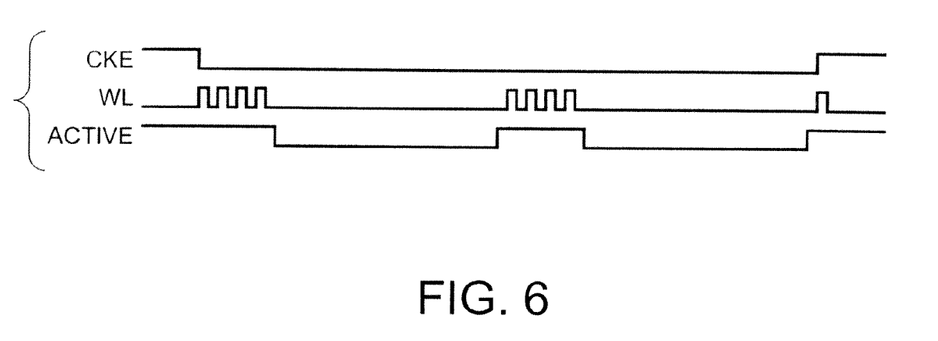
FIG. 6 is a time chart for use in describing operation of a DRAM circuit according to an exemplary embodiment of this invention.

FIG. 6 is a time chart for use in describing operation of the DRAM circuit 100. In FIG. 6, CKE represents a clock enable signal supplied from an outside, WL represents a timing signal produced by the row control circuit 128 in order to select the word line of the memory cell array 110 in accordance with the row address, and ACTIVE represents the active signal for activating, by making the SCRC driver turn on/off, the command and row-based control circuit SCRC area 120 to which the sub threshold current reduction circuit (SCRC) 300 (FIG. 2) is applied. The timing signal WL corresponds the internal active signal ACTS as shown in FIG. 5.

As apparent from FIG. 6, the exemplary embodiment switches to the standby after refreshing operation of four rows. Therefore, a switching count of the active signal ACTIVE is reduced and it results in reducing the charge and discharge current (the self-refresh current) in the sub threshold current reduction circuit (SCRC) 300 (FIG. 2) applied to the command and row-based control circuit SCRC area 120 by one-fourths of the prior art.

Generally, when the clock enable signal CKE becomes the logic "H" level, a self-refresh control circuit comes out of the self-refresh operation. The self-refresh control circuit 201 of the exemplary embodiment also comes out of the self-refresh operation when refresh of the row comes to end at a time when the clock enable signal CLK becomes the logic "H" level without continuing the self-refresh operation until refresh of the four rows completes. Accordingly, inasmuch as a timing at when the self-refresh control circuit 201 comes out of the self-refresh operation is identical with the prior art, the self-refresh control circuit 201 is equivalent to the prior art with respect to usability in view of the outside.

Now, description will be made as regards an optimum number N of the rows of the self-refresh (the number of the word lines). If the self-refresh is carried out the unit of N rows, a switching frequency of activation/inactivation in the command and row-based control circuit SCRC area 120 to which the sub threshold current reduction circuit (SCRC) 300 (FIG. 2) is applied becomes 1/N. Therefore, a control current (a part of the self-refresh current) of the command and row-based control circuit SCRC area 120 to which the sub threshold current reduction circuit (SCRC) 300 (FIG. 2) is applied becomes 1/N. Accordingly, the larger the number N becomes, the more it becomes advantage. However, there are customers which lower power consumption on self-refresh by reducing capacity of a power supply IC in a cellular phone or the like. Therefore, when a burst length T1 (a duration when the active signal ACTIVE takes the logic "H" level) becomes longer, there is a possibility that a malfunction occurs in the refresh because the power supply is lacking in capacity. Under the circumstances, it is suitable that the optimum number N of the rows of the self-refresh (the number of the word lines) lies in a range about four to eight, both inclusive.

It is apparent that the present invention is not limited to the above embodiments, but may be modified and changed without departing from the scope and spirit of the invention. For example, although the self-refresh control circuit 201 comprises the long period timer 204, the selection signal producing circuit, the standby/active switching circuit, and the internal activating circuit in the above-embodiments, the self-refresh control circuit is surely not restricted to such a structure.

This invention can be mounted to various semiconductor devices. That is, this invention can be applicable to, as the semiconductor devices, semiconductor products in general such as a CPU (Central Processing Unit), an MCU (Micro Control Unit), a DSP (Digital Signal Processor), an ASIC (Application Specific Integrated Circuit), an ASSP (Application Specific Standard Circuit) each comprising an information storing function, and so on. In addition, a device to which this application is applicable can be applied to semiconductor devices such as a SOC (System On Chip), an MCP (Multi Chip Package), a POP (Package On Package), and so on. The transistors may be field effect transistors (FETs) and can be applicable to various FETs such as not only MOS (Metal Oxide Semiconductor) but also MIS (Metal-Insulator Semiconductor), TFT (Thin Film Transistor), or the like. The transistors may be transistors other than TFTs. In addition, a P-channel transistor or a PMOS transistor is a typified example of a first conductive-type transistor while an N-channel transistor or an NMOS transistor is a typical example of a second conductive-type transistor. Furthermore, a semiconductor substrate is not restricted to a P-type semiconductor substrate and may be other semiconductor substrates such as an N-type semiconductor substrate and a semiconductor substrate having a SOI (Silicon on Insulator) structure.

What is claimed is:

1. A semiconductor device comprising:
a memory cell array comprising a plurality of word lines, a plurality of bit lines each intersecting the word lines, and a plurality of memory cells each disposed at an associated one of intersections of the word and bit lines;
a row-based control circuit taking an active state, to access the memory cell array, and a standby state, to suspend accessing the memory cell array, the row-based control circuit being equipped with a current reduction circuit to reduce a power consumption during the standby state and configured to respond to a refresh command to take the active state at least twice with an intervention of the standby state therebetween, the row-based control circuit being further configured to activate two or more of the word lines each time the active state is being taken so that each of the memory cells coupled to the two or more of the word lines can be refreshed; and
a control signal generation circuit that generates a periodic refresh request signal in response to the refresh command,
wherein, each active state has an interval less than a period of the refresh request signal and occurs within a period of the refresh request signal, and each successive active state occurs within respective successive periods of the refresh request signal for a duration of the refresh command.

2. The device as claimed in claim 1, wherein the refresh command designates a self-refresh mode in which four or more of the word lines are to be refreshed during a self-refresh period.

3. The device as claimed in claim 1, wherein the current reduction circuit comprises a sub-threshold current reduction circuit.

4. The device as claimed in claim 1, wherein the row-based control circuit comprises a plurality of logic circuits each including first and second power nodes, selected ones of the logic circuits being coupled at the first power node to a first power line and at the second power node to a second power line and remaining ones of the logic circuits being coupled at the first power node to a third power line and at the second power node to a fourth power line; and
wherein the current reduction circuit comprises a first transistor connected between the first and third power lines and a second transistor connected between the second and fourth power lines, each of the first and second transistors being rendered conductive in the active state and nonconductive in the standby state.

5. The device as claimed in claim 4, wherein one of the first and second power lines is supplied with a first power potential and one of the third and fourth power lines is supplied with a second power potential, the other of the first and second power lines taking the first power potential by the first transistor being rendered conductive, and the other of the third and fourth power lines taking the second power potential by the second transistor being rendered conductive.

6. A semiconductor device comprising:
a memory cell array comprising a plurality of word lines, a plurality bit lines each intersecting the word lines, and a plurality of memory cells each disposed at an associated one of intersections of the word and bit lines;
a row-based control circuit brought into an active state to access the memory cell array and into a standby state to suspend accessing the memory cell array, the row-based control circuit being equipped with a current reduction circuit to reduce a power consumption during the standby state and configured to respond to a refresh command to be brought into the active state, then into the standby state from the active state and again into the active state from the standby state, the row-based control circuit being further configured to activate two or more of the word lines in response to a first occurrence of the active state and to activate other two or more of the word lines in response to a next occurrence of the active state so that each of the memory cells coupled to the four or more of the word lines are refreshed in response to the refresh command, with a first occurrence of the standby state occurring between the first and second occurrences of the active state; and
a control signal generation circuit that generates a periodic refresh request signal in response to the refresh command,
wherein the first occurrence of the active state and the first occurrence of the standby state are completed within a first period of the refresh request signal, and the second occurrence of the active stated and another occurrence of the standby state are completed in a second period of the refresh signal subsequent to the first period.

7. The device as claimed in claim 6, wherein the refresh command designates a self-refresh mode.

8. The device as claimed in claim 6, wherein the current reduction circuit comprises a sub-threshold current reduction circuit.

9. The device as claimed in claim 6, wherein the row-based control circuit comprises a plurality of logic circuits each including first and second power nodes, selected ones of the logic circuits being coupled at the first power node to a first power line and at the second power node to a second power line and remaining ones of the logic circuits being coupled at the first power node to a third power line and at the second power node to a fourth power line, and
wherein the current reduction circuit comprises a first transistor connected between the first and third power lines and a second transistor connected between the second and fourth power lines, each of the first and second transistors being rendered conductive in the active state and nonconductive in the standby state.

10. A method comprising:
bringing a row-based control circuit into an active state to have the row-based control circuit access a memory cell array, the memory cell array comprising a plurality of word lines, a plurality bit lines each intersecting the word lines, and a plurality of memory cells each disposed at an associated one of intersections of the word and bit lines;
bringing the row-based control circuit into a standby state to have the row-based control circuit suspend accessing the memory cell array, the row-based control circuit being equipped with a current reduction circuit to reduce a power consumption during the standby state;
bringing, in response to a refresh command, the row-based control circuit into the active state, then into the standby state and again into the active state so that the row-based control circuit activates two or more of the word lines each time the row-based control circuit is brought into the active state; and generating a periodic refresh request signal in response to the refresh command, wherein each period of the refresh request signal has a duration that includes a single active state occurrence and a single standby state occurrence.

11. The method as claimed in claim 10, wherein the refresh command designates a self-refresh mode.

12. The method as claimed in claim 10, wherein the current reduction circuit comprises a sub-threshold current reduction circuit.

13. The method as claimed in claim 10, wherein the row-based control circuit comprises a plurality of logic circuits each including first and second power nodes, selected ones of the logic circuits being coupled at the first power node to a first power line and at the second power node to a second power line and remaining ones of the logic circuits being coupled at the first power node to a third power line and at the second power node to a fourth power line, wherein the current reduction circuit comprises a first transistor connected between the first and third power lines and a second transistor connected between the second and fourth power lines, each of the first and second transistors being rendered conductive in the active state and nonconductive in the standby state, and wherein the bringing the row-based control circuit into the active state comprises turning each of the first and second transistors ON and the bringing the row-based control circuit into the standby state comprises turning each of the first and second transistors OFF.

14. The semiconductor device as claimed in claim 2, wherein the row-based control circuit comprises a command decoder that is configured to supply a self-refresh duration signal to the control signal generation circuit when the self-refresh mode is designated, and wherein the control signal generation circuit comprises a timer circuit that generates the periodic refresh request signal based upon the self-refresh duration signal.

15. The semiconductor device as claimed in claim 14, wherein each period of the refresh request signal corresponds to an occurrence of one active state and one standby state.

16. The semiconductor device as claimed in claim 14, wherein the command decoder supplies a refresh end signal to the control signal generation circuit, and wherein the control signal generation circuit is configured to:

generate a first signal based on the refresh end signal and the refresh request signal;

generate a second signal based on a count of the first signal, the count corresponding to the number of the two or more word lines activated each time the active state is taken; and generate an internal active signal based on the first and second signals, wherein the refreshing of each of the two or more word lines during each active state is controlled by the internal active signal.

17. The device as claimed in claim 6, wherein the row-based control circuit comprises a command decoder that generates a self-refresh duration signal when the self-refresh mode is designated, and wherein the control signal generation circuit comprises a timer circuit that generates the periodic refresh request signal based upon the self-refresh duration signal.

18. The device as claimed in claim 9, wherein each of the plurality of logic circuits comprises at least one transistor, and wherein the first and second transistors have threshold voltages that are greater than a threshold voltage of the at least one transistor of each of the plurality of logic circuits.

* * * * *